US009159598B2

United States Patent
Yamamoto et al.

(10) Patent No.: US 9,159,598 B2
(45) Date of Patent: Oct. 13, 2015

(54) SEMICONDUCTOR WAFER MOUNTING METHOD AND SEMICONDUCTOR WAFER MOUNTING APPARATUS

(75) Inventors: Masayuki Yamamoto, Ibaraki (JP);
Chouhei Okuno, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 599 days.

(21) Appl. No.: 13/454,477

(22) Filed: Apr. 24, 2012

(65) Prior Publication Data

US 2012/0298283 A1    Nov. 29, 2012

(30) Foreign Application Priority Data

May 27, 2011 (JP) .................. 2011-119262

(51) Int. Cl.
*B29C 65/50* (2006.01)
*H01L 21/67* (2006.01)

(52) U.S. Cl.
CPC ........... *H01L 21/67132* (2013.01); *B29C 65/50* (2013.01)

(58) Field of Classification Search
CPC ............. H01L 27/67132; H01L 21/6836; B29C 65/50
USPC ............ 156/64, 247, 930, 931, 940, 941; 414/222.02, 222.08, 223.02, 806, 936, 414/937, 938, 941
See application file for complete search history.

(56) References Cited

U.S. PATENT DOCUMENTS

| | | | |
|---|---|---|---|
| 6,856,858 B2 * | 2/2005 | Kurita | ............... 700/218 |
| 6,863,590 B2 | 3/2005 | Kobayashi | |
| 2006/0035563 A1 | 2/2006 | Kalenian et al. | |
| 2008/0023149 A1 | 1/2008 | Yamamoto | |
| 2008/0038903 A1 | 2/2008 | Yamamoto | |
| 2009/0226286 A1 | 9/2009 | Mikami | |
| 2009/0252580 A1 | 10/2009 | Takizawa et al. | |
| 2010/0300612 A1 | 12/2010 | Yamamoto et al. | |

FOREIGN PATENT DOCUMENTS

| | | |
|---|---|---|
| CN | 101023429 A | 8/2007 |
| CN | 101118844 A | 2/2008 |
| CN | 101123175 A | 2/2008 |
| CN | 101552219 A | 10/2009 |
| CN | 101901774 A | 12/2010 |
| JP | 2009-212430 A | 9/2009 |

OTHER PUBLICATIONS

The First Office Action for the Application No. 201210165199.4 from The State Intellectual Property Office of the People's Republic of China dated Jul. 16, 2014.

* cited by examiner

*Primary Examiner* — George Koch
(74) *Attorney, Agent, or Firm* — Cheng Law Group, PLLC

(57) ABSTRACT

A workpiece is unloaded from a wafer-receiving container. A first discriminating sensor detects a front surface of the workpiece, and determines either a semiconductor wafer or a spacer is the workpiece. Where the workpiece is a wafer, the first discriminating sensor also determines whether or not a protective tape is on the front surface of the workpiece. Where it is determined that a protective tape is not on the front surface, a second discriminating sensor detects a back surface of the wafer for discriminating the presence or absence of the protective tape.

4 Claims, 17 Drawing Sheets

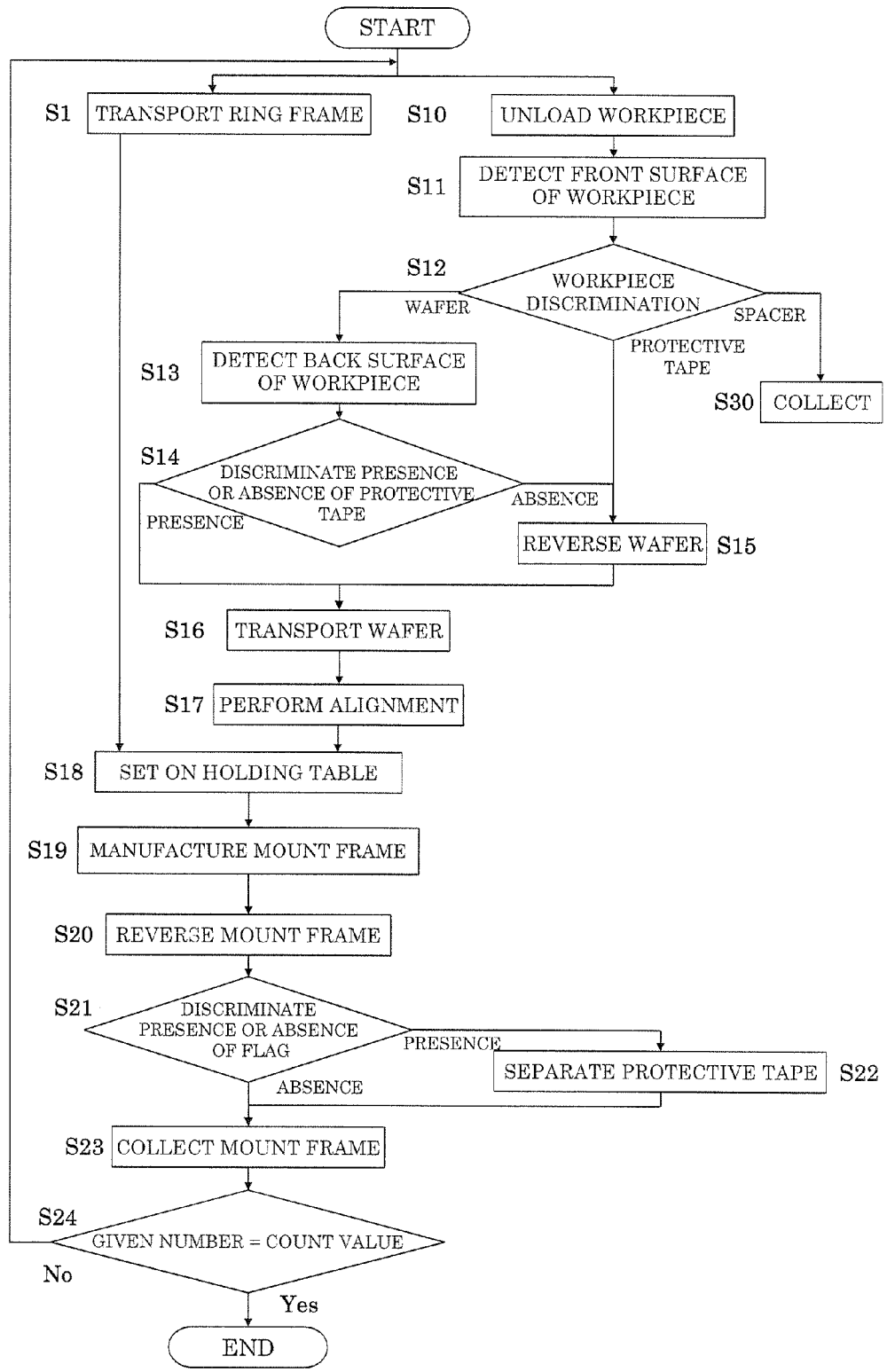

SEMICONDUCTOR WAFER MOUNTING METHOD AND SEMICONDUCTOR WAFER MOUNTING APPARATUS

BACKGROUND OF THE INVENTION

1. Field of the Invention

This invention relates to a semiconductor wafer mounting method and a semiconductor wafer mounting apparatus in which a semiconductor wafer (hereinafter, appropriately referred to as a "wafer") subjected to a back grinding process that is stacked via a spacer such as an inserting paper in a receiving container is unloaded from the container, and then is mounted onto a ring frame via a supporting adhesive tape.

2. Description of the Related Art

A plurality of semiconductor wafers and spacers are alternately stacked in a container for transporting the semiconductor wafers to every process. When the semiconductor wafer is transported out of the container with a front surface thereof being suction-held, the spacer on a back surface side of the semiconductor wafer adheres to a back surface of the semiconductor wafer due to static electricity. Then a spacer retaining mechanism is provided for separating the spacer from the back surface of the semiconductor wafer. See Japanese Patent Publication No. 2009-212430A.

An operator manually houses the semiconductor wafer and the spacer into the container. As a result, the following problem may arise. That is, a given number of semiconductor wafers should be housed, but the number of semiconductor wafers, which differs from the given number, may possibly be housed.

Moreover, the wafer and the spacer should be stacked alternately, but an operator may possibly house the wafer and the spacer without noticing of two or more stacked wafers or spacers. That is because the wafer and the spacer are each thin. In this case, the transport device changes the order of transportation since it transports the wafer and the spacer alternately to a given position. Consequently, the following problems may arise. That is, a wafer is accidentally transported to a spacer-receiving container for spacer and is disposed of, or a ring frame and a spacer are mounted on a supporting adhesive tape.

Furthermore, a wafer may be housed in the container with front and back surfaces thereof being reversed. In this case, there arises a problem that the wafer with the front and back surfaces thereof being reversed may be mounted on the ring frame.

SUMMARY OF THE INVENTION

This invention has been made regarding the state of the art noted above, and its primary object is to provide a semiconductor wafer mounting method and a semiconductor wafer mounting apparatus that enable manufacture of a mount frame through accurate determination of a semiconductor wafer in a receiving container and of a condition where the semiconductor wafer is housed in the container.

Additional features of the invention will be set forth in the description which follows, and in part will be apparent from the description, or may be learned by practice of the invention.

This invention is constituted as stated below to achieve the above object.

This invention discloses a semiconductor wafer mounting method for mounting a semiconductor wafer on a ring frame via a supporting adhesive tape. The method includes:

during transportation of each carrying-out object of the semiconductor wafers or spacers that are alternately stacked in a receiving container by a transport mechanism, detecting a front surface of the carrying-out object by a first discrimination sensor and discriminating the carrying-out object in accordance with detection result;

(a) where it is determined from discrimination by the first discriminating sensor that the carrying-out object is a semiconductor wafer, determinating whether or not a protective tape is on the front surface of the semiconductor wafer, and
reversing the semiconductor wafer by the transport mechanism such that the face with the protective tape is directed downward when the protective tape is on the front surface of the semiconductor wafer, and
detecting a back surface of the semiconductor wafer by a second discrimination sensor for determination of whether or not the protective tape is on the back surface of the semiconductor wafer when the protective tape is not on the front surface of the semiconductor wafer, and
where it is determined from discrimination by the second discrimination sensor that the protective tape is on the back surface of the semiconductor wafer,
keeping the face with the protective tape directed downward, placing the semiconductor wafer having the face with the protective tape directed downward by the transport mechanism onto an alignment stage and aligning the semiconductor wafer with the alignment stage,
joining the supporting adhesive tape over both back surfaces of the aligned semiconductor wafer and the ring frame with a tape joining mechanism,
reversing a mount frame having the ring frame integrated with the semiconductor wafer to place it on a holding table by the transport mechanism, and
separating the protective tape on the front surface by a separating mechanism; and
collecting the mount frame from which the protective tape is separated, and
where it is determined from discrimination by the second discrimination sensor that the protective tape is not on the back surface of the semiconductor wafer,
comparing the detection results of the front and back surfaces of the semiconductor wafer and determinating a circuit surface thereof
placing the semiconductor wafer having the circuit surface directed downward by the transport mechanism onto the alignment stage and aligning it with the alignment stage,
joining the supporting adhesive tape over both the back surfaces of the aligned semiconductor wafer and the ring frame with the tape joining mechanism, and
collecting the mount frame having the ring frame integrated with the semiconductor wafer; and (b) where it is determined from the discrimination by the first discriminating sensor that the carrying-out object is a spacer, transporting the spacer into a spacer collecting section by the transport mechanism.

According to the method mentioned above, the first discriminating sensor discriminates either the semiconductor wafer or the spacer is the carrying-out object unloaded from the container. Simultaneously, the first discriminating sensor enables to determine from the front surface of the carrying-out object whether or not the protective tape is on the front surface of the wafer.

Moreover, the second discriminating sensor enables to determine whether or not the protective tape is on the back surface of the wafer. Furthermore, comparison between the detection results of the first and the second discriminating sensors can achieve determination of the circuit surface of the semiconductor wafer without the protective tape. Consequently, accidental mounting of the spacer can be avoided upon manufacture of the mount frame. In addition, accidental mounting of the semiconductor wafer in different directions can be avoided. Accidental disposal of the semiconductor to the spacer collecting section can also be avoided.

The semiconductor wafer mounting method mentioned above preferably includes: disposing the first discriminating sensor above the receiving container and detecting the front surface of the carrying-out object during lifting up the semiconductor wafer from the receiving container by the transport mechanism; and disposing the second discriminating sensor adjacent to an outer periphery of the receiving container and detecting the back surface of the semiconductor wafer through horizontal movement of the transport mechanism.

According to this method, the front and back surfaces of the carrying-out object can be determined accurately with a minimized moving distance of the transport mechanism.

Moreover, in this method, the spacer has permeability. Where it is determined that the protective tape is not on the semiconductor wafer, the semiconductor wafer is returned to the receiving container, and a spacer is unloaded from the spacer-collecting section by the transport mechanism and is transported to a joining position of the adhesive tape. The semiconductor wafer is unloaded from the receiving container by the transport mechanism, is placed on the spacer with the circuit surface of the aligned semiconductor wafer being directed downward, and the adhesive tape is joined over the both the back surfaces of the ring frame and the semiconductor wafer to manufacture a mount frame. The manufactured mount frame is carried out, and then the spacer is unloaded from and transported into the spacer-collecting section. Such configuration may be adopted.

According to this method, although the semiconductor wafers with and without the protective tape are mixed in the container, a mount frame can be manufactured without stopping the apparatus.

Moreover, in the method mentioned above, the first discriminating sensor determines a cushioning material on the bottom of the receiving container. The transport mechanism returns the cushioning material to the receiving container when it is determined that the carrying-out object is the cushioning. Such configuration may be adopted.

This invention also discloses a semiconductor wafer mounting apparatus for mounting a semiconductor wafer on a ring frame via a supporting adhesive tape. The apparatus includes a container, a transport mechanism, a first discriminating sensor, a second discriminating sensor, a front-surface discriminating section, a back-surface discriminating section, an alignment stage, a tape joining mechanism, a separating mechanism, a wafer-collecting section, and a spacer-collecting section. The container houses the semiconductor wafers and spacers in a stack manner. The transport mechanism unloads the semiconductor wafers and the spacers from the container and reverses them. The first discriminating sensor detects a front surface of a carrying-out object held and unloaded from the container by the transport mechanism. The second discriminating sensor detects a back surface of the carrying-out object. The front-surface discriminating section discriminates either the semiconductor wafer or the spacer is the carrying-out object in accordance with detection result from the first discriminating sensor, and further determines whether or not a protective tape is on the semiconductor wafer when it is determined that the carrying-out object is the semiconductor wafer. The back-surface discriminating section determines whether or not the protective tape is on the back surface of the semiconductor wafer in accordance with detection result from the second discriminating sensor when the front-surface discriminating section determines that the protective tape is not on the front surface of the semiconductor wafer, and determines a circuit surface of the semiconductor wafer through comparison of the detection results from the first and second discriminating sensors when it is determined that the protective tape is not on the back surface of the semiconductor wafer. The alignment stage aligns the semiconductor wafer. The tape joining mechanism joins the adhesive tape over the back surfaces of the aligned semiconductor wafer and the ring frame, thereby manufacturing a mount frame. The separating mechanism separates the protective tape from the semiconductor wafer on the mount frame when the protective tape is on the semiconductor wafer. The wafer-collecting section collects the mount frame. The spacer-collecting section collects the spacer.

This configuration may achieve suitable implementation of the above method.

Moreover, in the foregoing configuration, the first discriminating sensor is disposed above the container. The second discriminating sensor is disposed adjacent to an outer periphery of the container and on a horizontal transportation path of the transport mechanism. Such configuration is preferable.

This configuration can achieve determination of the carrying-out object and conditions of the front and back surfaces thereof with minimized movement of the transport mechanism.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 20 is a flow chart showing operations of an apparatus in this example.

DESCRIPTION OF THE PREFERRED EMBODIMENTS

Figure 1:
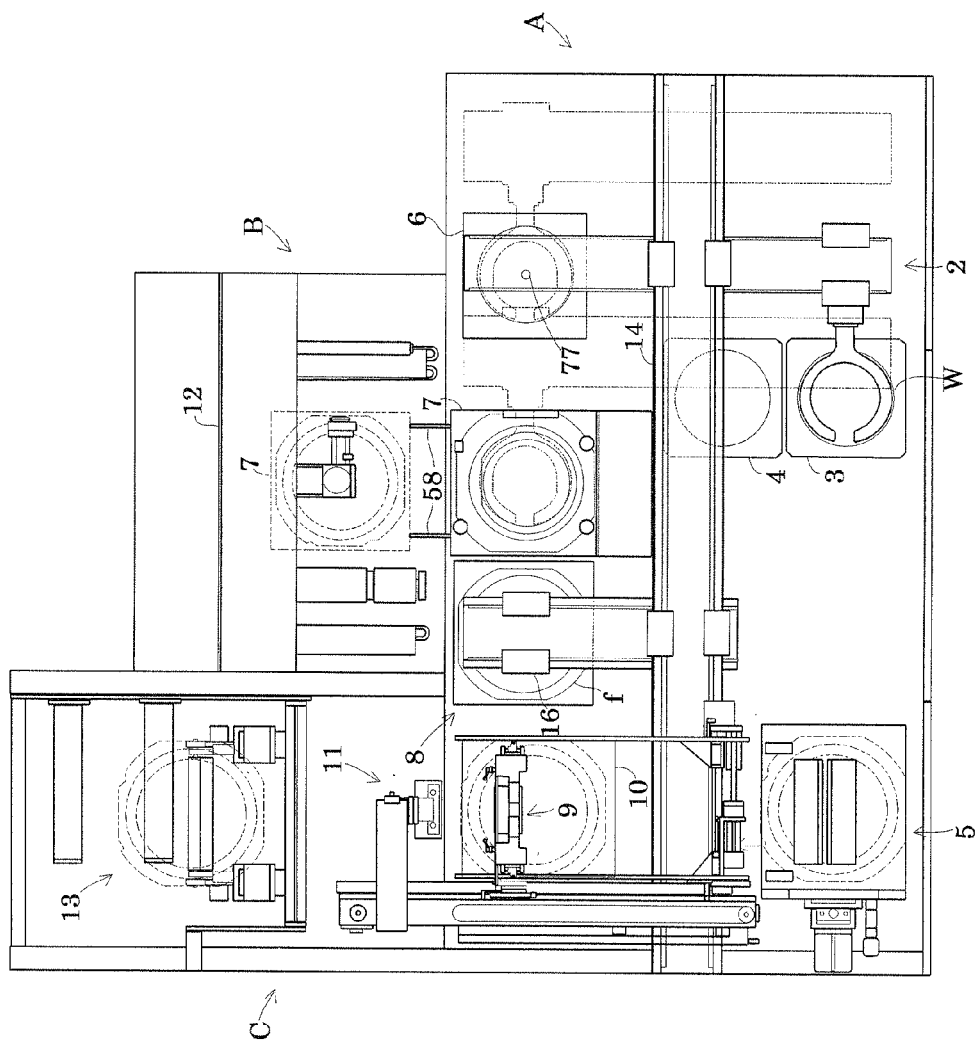
FIG. 1 is a plan view of a semiconductor wafer mounting apparatus.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

One embodiment of this invention will be described hereunder with reference to the drawings.

Figure 2:
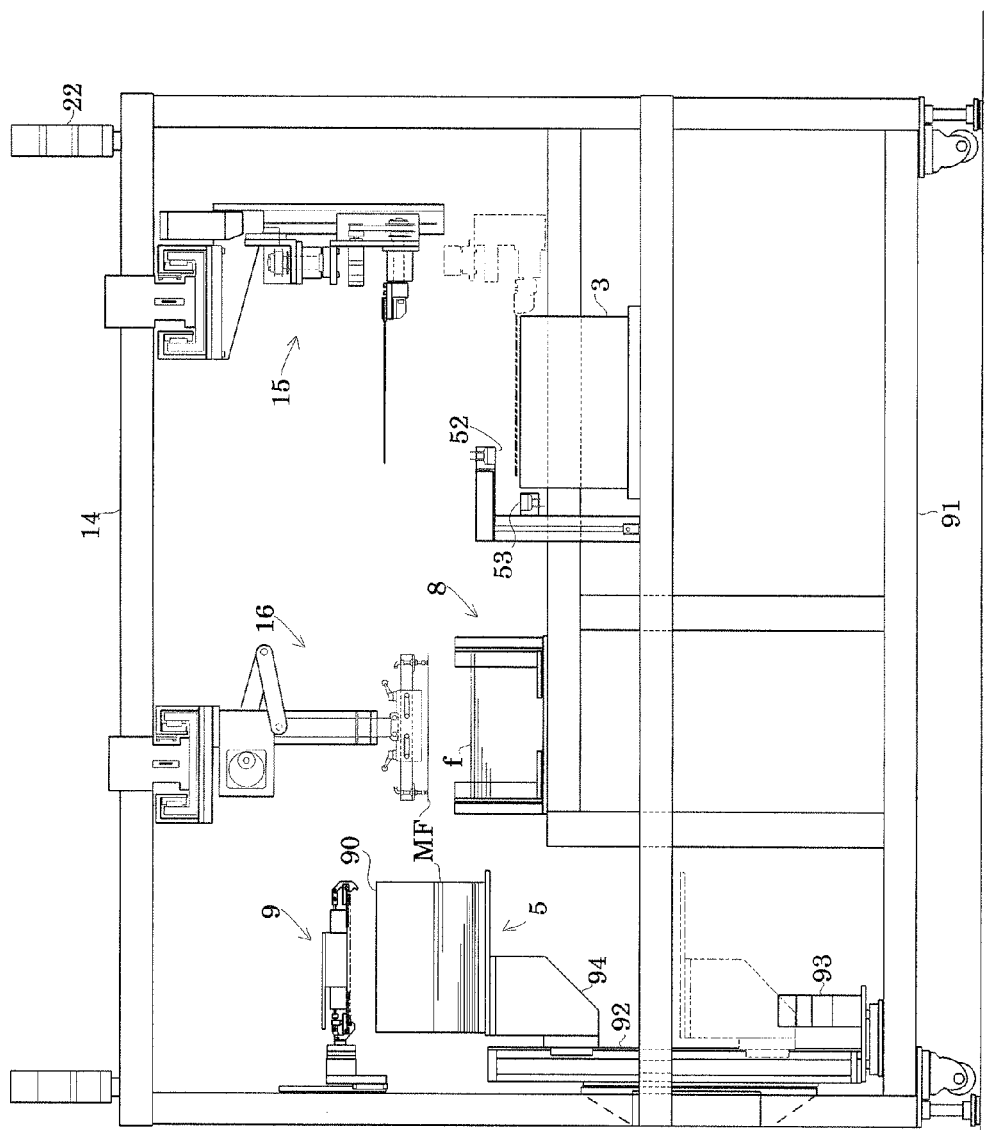
FIG. 2 is a front view of the semiconductor wafer mounting apparatus.

FIG. 1 shows a plan view of a semiconductor wafer mounting apparatus, and FIG. 2 a front view thereof.

As shown in FIG. 1, the semiconductor wafer mounting apparatus includes a basic unit with a laterally extending rectangular section A and a protrusion section B connected to on a center of the rectangular section A so as to protrude upward in plane, thereby having an inverted "T" shape, and a separation unit C on the left side of the protrusion section B that is connected to the basic unit. Here, in the following description, a longitudinal direction of the rectangular section A is defined as a horizontal direction. Moreover, a vertical direction orthogonal to the horizontal direction is defined as upper and lower directions.

The rectangular section A has a workpiece transport mechanism 2 at a lateral center thereof. The rectangular section A has a wafer receiving container 3 and a spacer collecting container 4 arranged in parallel on the lower right side thereof. The rectangular section A has a mount-frame collecting section 5 on the lower left side thereof.

The rectangular section A has an aligner 6, a holding table 7, a frame supply section 8, and a reversing unit 9 in this order on the upper side thereof. A separation table 10 is disposed below the reversing unit 9. A pusher 11 is disposed across the rectangular section A and the separation unit C.

The protrusion section B has a tape joining mechanism 12. The tape joining mechanism 12 joins a supporting adhesive tape DT to a ring frame f.

The separation unit C has a separation mechanism 13. The separation mechanism 13 separates a protective tape PT from a front surface of a semiconductor wafer W (hereinafter, simply referred to as a "wafer W".)

The transport mechanism 2 includes a workpiece transport device 15 and a frame transport device 16 as shown in FIG. 2. The workpiece transport device 15 is supported at the right side of a guide rail 14 so as to reciprocate horizontally. Herein, the guide rail 14 is provided horizontally at the upper side of the rectangular section A so as to extend horizontally. On the other hand, the frame transport device 16 is supported at the left side of the guide rail 14 so as to move horizontally.

The workpiece transport device 15 unloads the wafer W and a spacer 17 from the wafer receiving container 3, and then transports them in the forward/backward and horizontal directions. Further, the workpiece transport device 15 can turn the wafer W upside down. FIGS. 3 to 9 show a detailed structure of the workpiece transport device 15.

Figure 3:
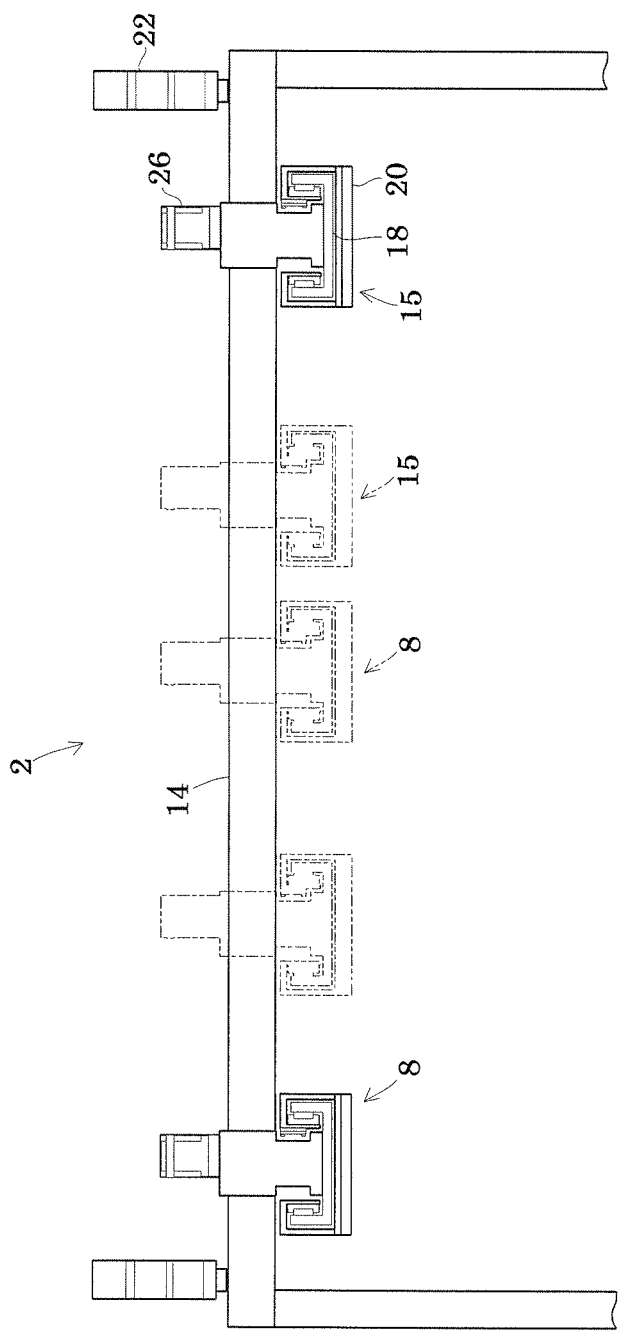
FIG. 3 is a front view partly showing a workpiece transport mechanism.
Figure 5:
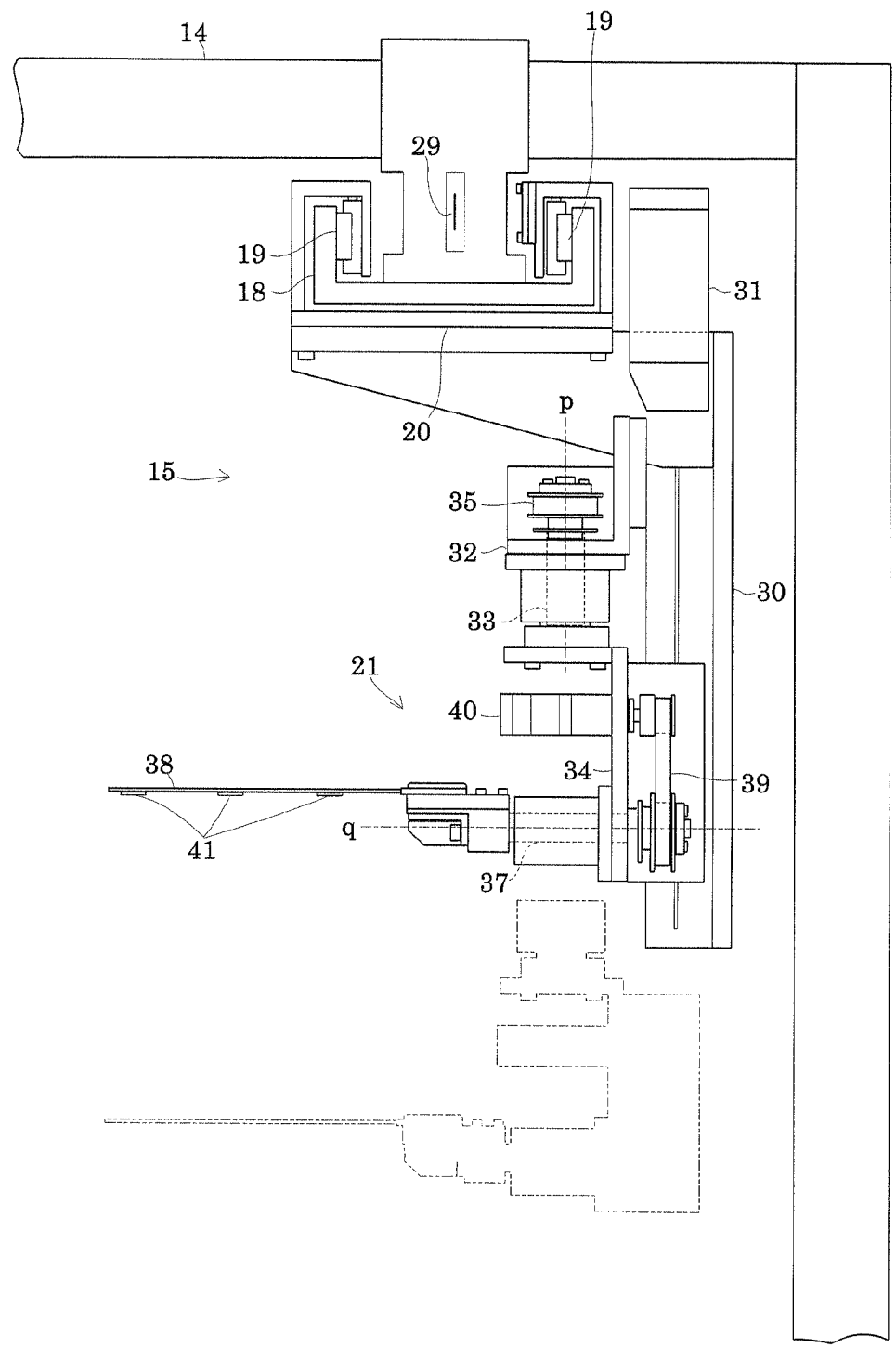
FIG. 5 is a front view of a workpiece transport device.

As shown in FIGS. 3 and 5, the workpiece transport device 15 includes a movable table 18 that moves horizontally along the guide rail 14. The workpiece transport device 15 also includes a movable table 20 that moves forward/backward along a guide rail 19 provided on the movable table 18. The workpiece transport device 15 further includes a holding unit 21. The holding unit 21 is provided below the movable table 20 for holding the wafer W and the spacer 17.

Figure 4:
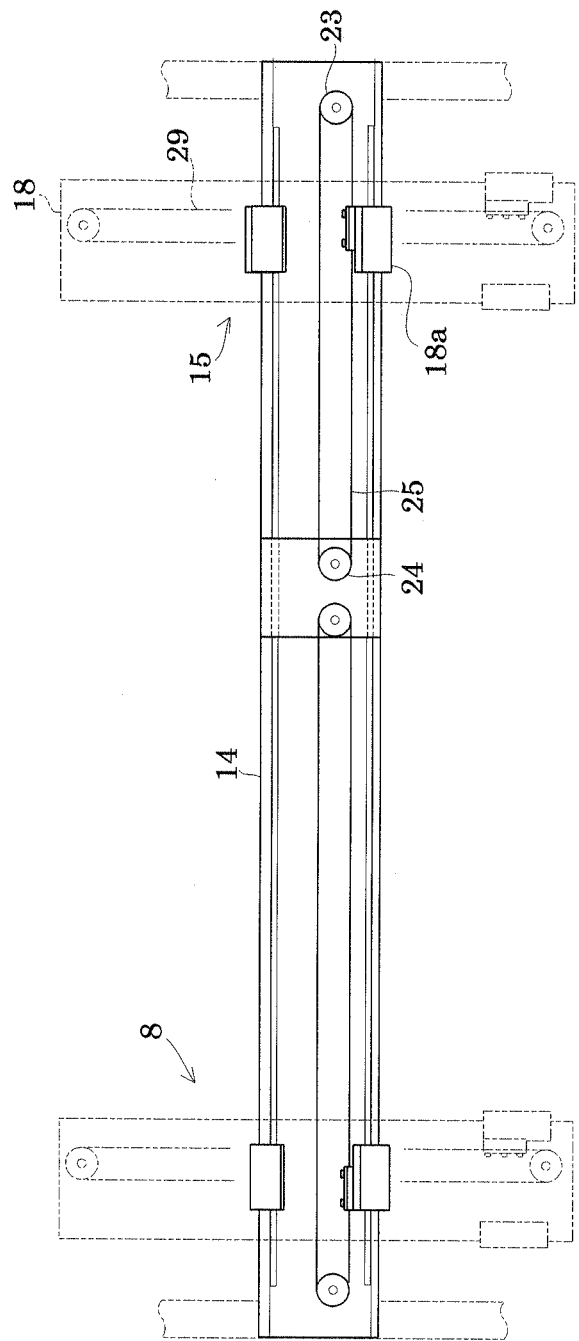
FIG. 4 is a plan view partly showing the workpiece transport mechanism.

As shown in FIGS. 3 and 4, a driving pulley 23 is pivotally supported adjacent to the right end of the guide rail 14 and is driven by a motor 22 so as to rotate forward/backward. Moreover, an idling pulley 24 is pivotally supported adjacent to the center of the guide rail 14. Further, a belt 25 is wound between the driving pulley 23 and the idling pulley 24, and a slide engagement part 18a of the movable table 18 is coupled to the belt 25. Consequently, the belt 25 rotates forward/backward, and accordingly the movable table 18 moves horizontally.

Figure 6:
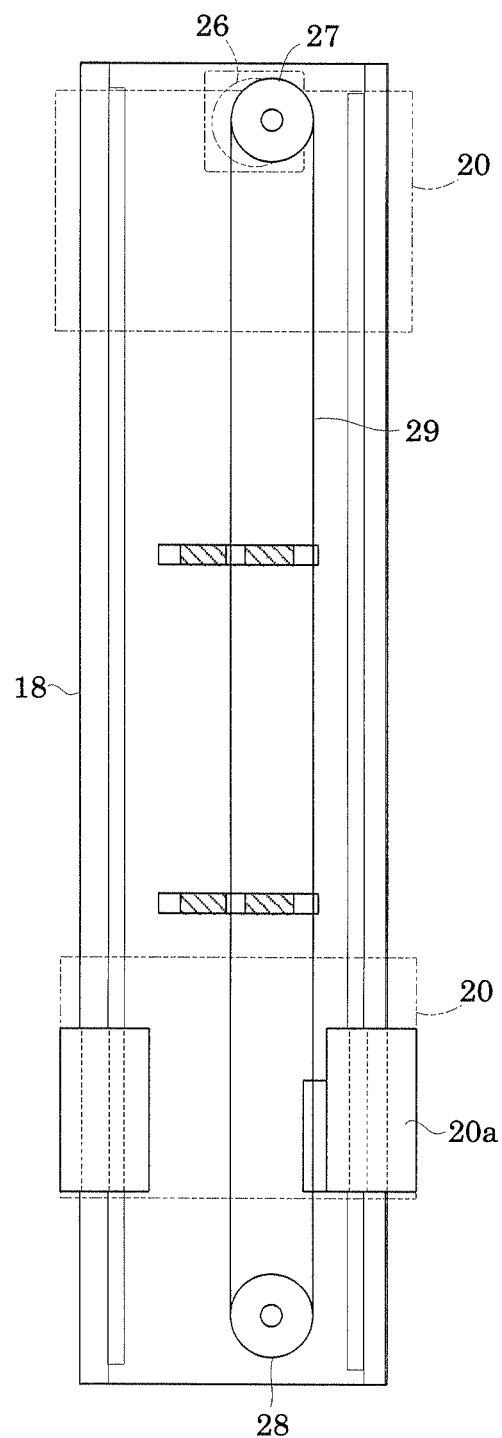
FIG. 6 is a plan view showing a movement structure of the workpiece transport device.
Figure 7:
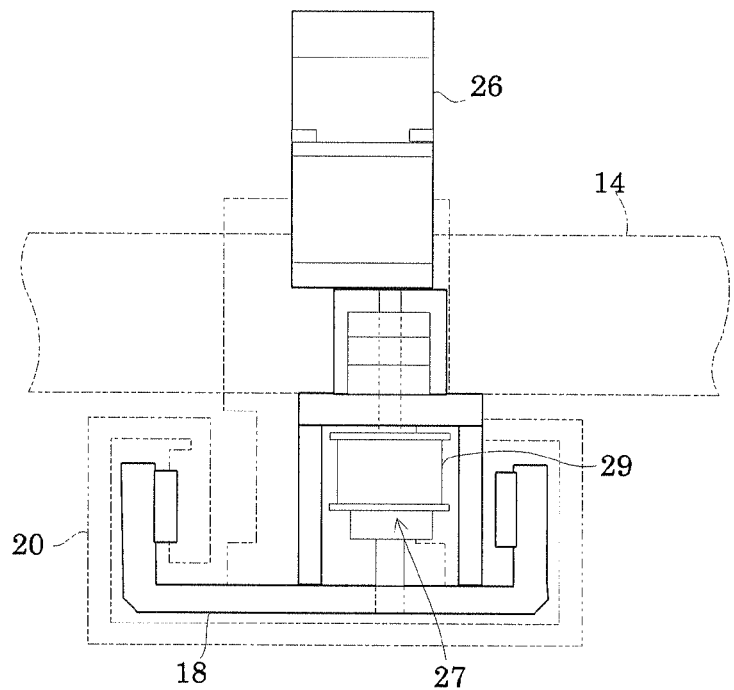
FIGS. 7 and 8 are front views each partly showing a front-to-rear movement structure of the workpiece transport device.
Figure 8:
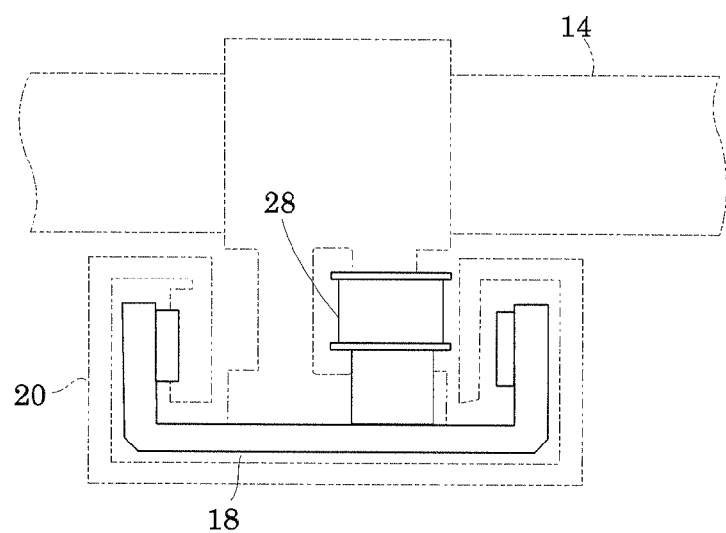

As shown in FIGS. 6 through 8, a driving pulley 27 is pivotally supported adjacent to the upper end of the movable table 18 and is driven by a motor 26 so as to rotate forward/backward. Moreover, an idling pulley 28 is pivotally supported adjacent to the lower end of the movable table 18. Further, a belt 29 is wound between the driving pulley 27 and the idling pulley 28. A slide engagement part 20a of the movable table 20 is coupled to the belt 29. Consequently, the belt 29 rotates forward/backward, and accordingly the movable table 20 moves horizontally.

As shown in FIG. 5, the holding unit 21 includes an inverted L-shaped support frame 30, a lifting table 32, a turning table 34, a pivoting motor, a holding arm 38 and a reverse rotating motor 40. The support frame 30 is connected to the lower position of the movable table 20. A motor 31 drives the lifting table 32 in a screw feed manner along an upright frame of the support frame 30. The turning table 34 is pivotally supported on the lifting table 32 via a turning axis 33 for pivoting about a vertically oriented axis p. The pivoting motor is wound around the turning axis 33 via a belt 35 for interlocking with each other. The holding arm 38 is supported on the lower position of the turning table 34 for reverse rotation about a horizontal axis q. The reverse rotating motor 40 is wound around the turning axis 37 via a belt 39 for interlocking with each other.

The holding arm 38 has a U-shape. The holding arm 38 has pads 41 formed on a holding surface thereof that project slightly. The pad 41 has holes of a small diameter inwardly from the surface thereof that are formed concentrically at given pitches. The holes are in communication with one channel formed inside the holding arm 38. Each hole is tapered from the channel inside toward a holding surface of the holding arm 34. The pads 41 each having a group of the holes are placed on a given position on the holding surface. The holding arm 38 is in communication with a compressor via the channel formed therein and a connection channel coupled to a proximal end of the channel.

A controller switches driving of the compressor. Specifically, the compressor is driven under negative pressure, whereby the pads 41 of the holding arm 38 suction-hold the back surface of the wafer W or the spacer 17. Moreover, the compressor is switched to be driven under positive pressure, whereby the holding arm 38 turns upside down and compressed air is sprayed on the wafer W or the spacer 17 from the holes directed downward, and negative pressure is generated between a mounting surface of the pad 41 and the uppermost wafer W or the spacer 17. Consequently, the uppermost wafer W or the spacer 17 can be suspendingly held. That is, it can function as a Bernoulli chuck.

Use of the movable structure described above can achieve the following advantages. That is, the suction-held wafer W and the spacer 17 can be moved in forward/backward and horizontal directions, and can be turned about the vertically-oriented axis p with the holding arm 38. Moreover, as shown in FIG. 5, the wafer W can also be turned upside down through the reverse rotation about the horizontally-oriented axis q.

Figure 9:
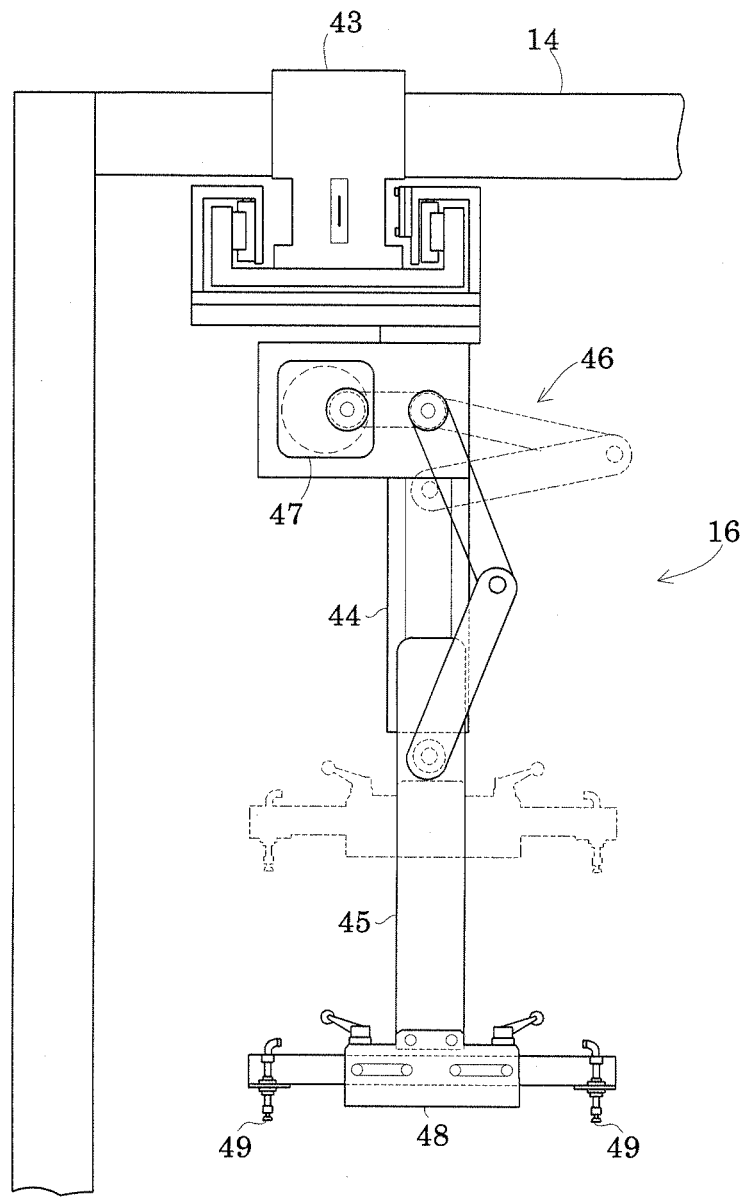
FIG. 9 is a front view showing the frame transport device.

As shown in FIG. 9, the frame holding transport device 16 includes an upright frame 44 connected to a bottom of a movable table 43 that moves forward/backward, a lifting frame 45 supported so as to slide vertically along the upright frame 44, a bendable link mechanism 46 for moving the lifting frame 45 vertically, a motor 47 for bending the bendable link mechanism 46 forward/backward, a suction plate 48 provided at the lower end of the lifting frame 45 for sucking the ring frame f, and suction pads 49 provided at the periphery of the suction plate 48. Thus, the frame transport device 16 can suction-hold the mount frame MF placed on the holding table 7 to transport the mount frame MF vertically, forward/backward and horizontally. Herein, the suction pad 49 is slidingly adjustable in the horizontal direction in accordance with a size of the ring frame f.

Figure 10:
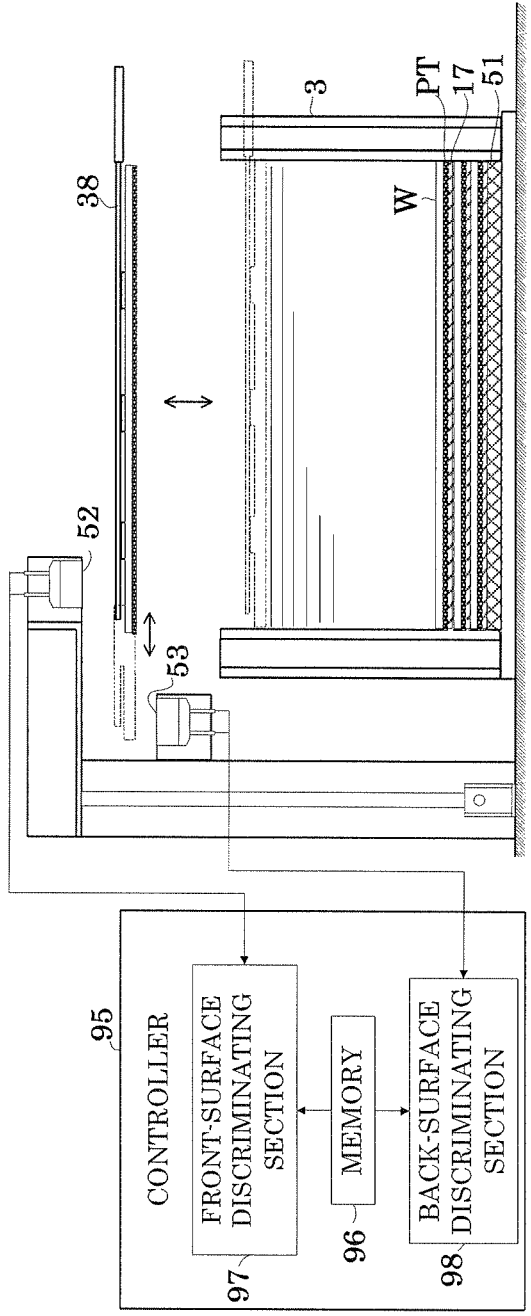
FIG. 10 is a front view including the surrounding of a wafer receiving container.
Figure 11:
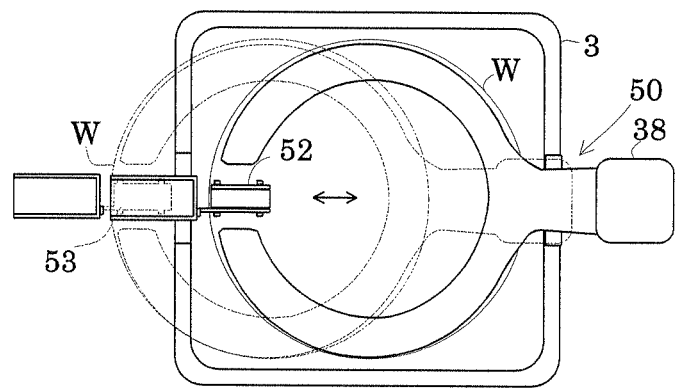
FIG. 11 is a schematic view of detecting a wafer unloaded from the container.

As shown in FIGS. 10 and 11, the wafer-receiving container 3 has a cut-out portion 50 formed as an approach path of the workpiece transport device 15. The cushioning material 51 composed of an elastic material is laid on the bottom face of the container 3. The spacers 17, such as an inserting paper, and the wafers W are stacked alternately in this order on the cushioning material 51.

A first discrimination sensor 52 having a detecting surface directed downward is placed above the container 3. A second discrimination sensor 53 having a detecting surface directed upward is placed adjacent to the outer periphery of the container 3. The second discrimination sensor 53 is placed below the first discrimination sensor 52. In this example, a color sensor is used as the first discrimination sensor 52 and second discrimination sensor 53.

The spacer-collecting container 4 has the same shape as the container 3. Thus, a cut-out portion is formed as an approach path of the holding arm 38 of the workpiece transport device 15.

Figure 12:
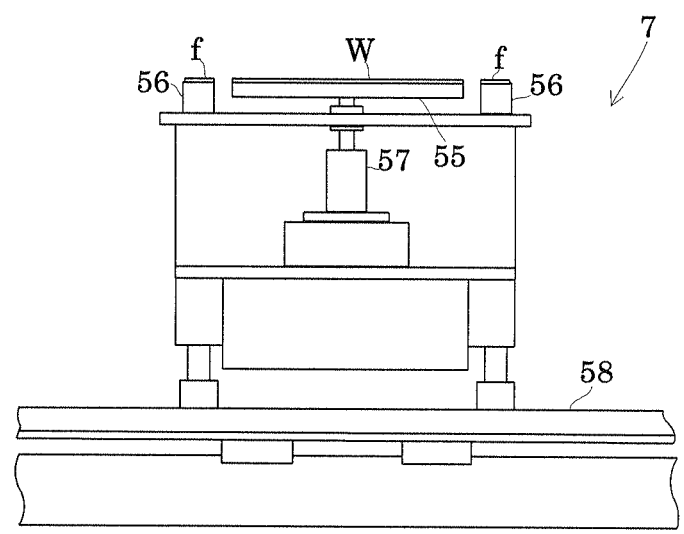
FIG. 12 is a front view of a holding table.

The holding table 7 aligns the ring frame f by a movable pin that moves forward/backward. As shown in FIG. 12, the holding table 7 has a holding table 55 at a center thereof and a frame holder 56. The holding table 55 holds the wafer W. The frame holder 56 surrounds the wafer holding table 55.

The holding table 55 is a metal chuck table. The holding table 55 is in communication with an external vacuum device via a channel that is formed therein. The holding table 55 moves upward and downward with a cylinder 57. Here, the holding table 55 is not limitedly metal, but may be formed of a ceramic porous material.

The frame holder 56 has a step formed therein with an equal thickness to that of the frame. That is, the frame holder 56 is configured such that an upper surface of the ring frame f is equal in level to the top of the frame holder 56 upon placing the ring frame f in the step.

As shown in FIG. 1, the holding table 7 can reciprocate with a drive mechanism, not shown, along a rail 58 between a set position of the wafer W and the adhesive tape joining mechanism 12.

The frame supply unit 8 houses a draw-type cassette with a given number of ring frames houses therein.

Figure 13:
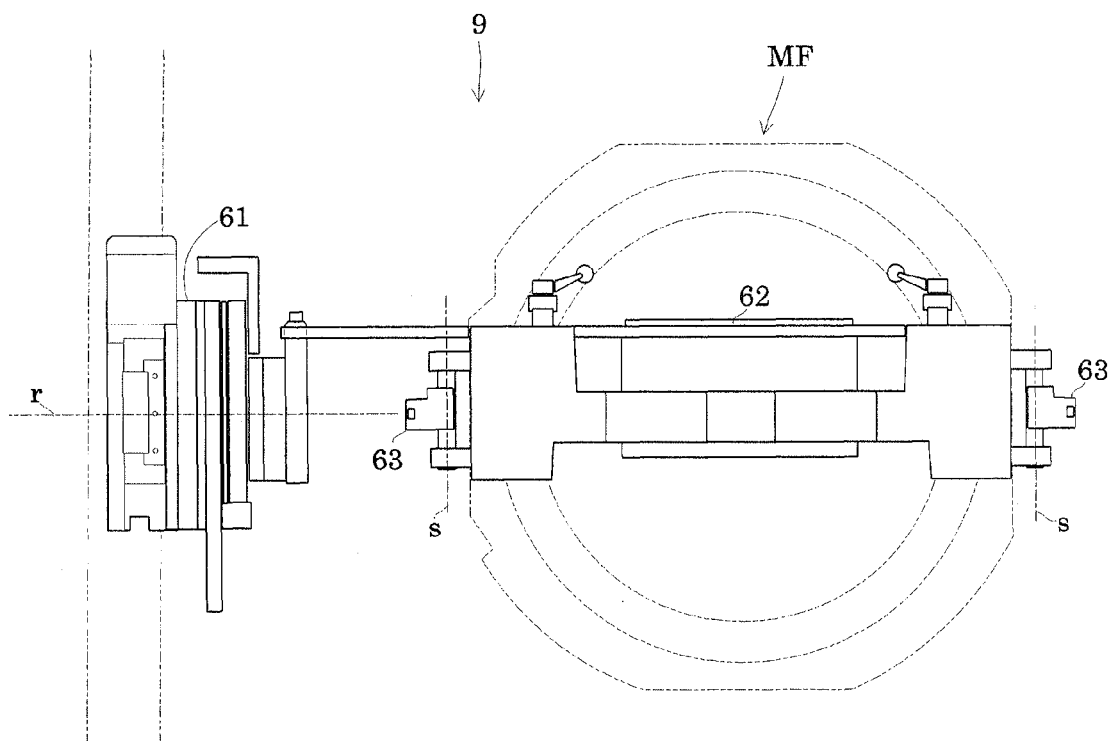
FIG. 13 is a plan view of a reversing unit.
Figure 14:
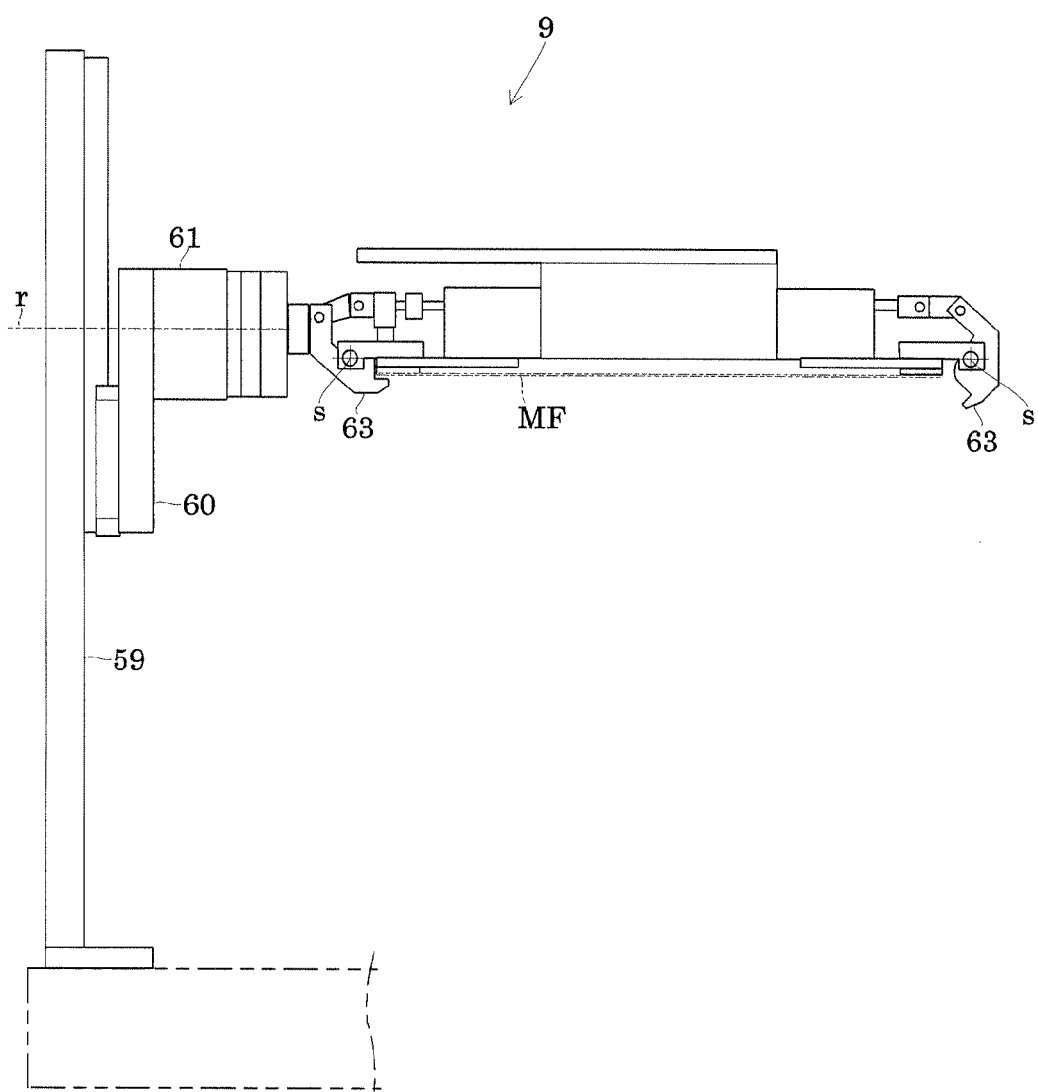
FIG. 14 is a front view of the reversing unit.

As shown in FIGS. 13 and 14, the reversing unit 9 includes a lifting table 60 capable of lifting along an upright rail 59 that is fixedly erected. Moreover, a receiving frame 62 is attached on the lifting table 60 in a cantilever manner. The receiving frame 62 can rotate about a horizontal axis r by a rotation actuator 61. Moreover, chuck claws 63 are provided at a distal end and a proximal end of the receiving frame 62, respectively, so as to rotate about an axis s. The reversing unit 9 receives the mount frame MF having a circuit surface directed downward from the frame transport device 16, and then reverses the mount frame MF. As a result, the circuit surface of the mount frame MF is directed upward. Then the reversing unit 9 places the mount frame MF on the separation table 10.

The separation table 10 reciprocates between a position directly under the reversing unit 9 where the mount frame MF is received and a position of the separation unit C where the protective tape PT is separated.

Figure 15:
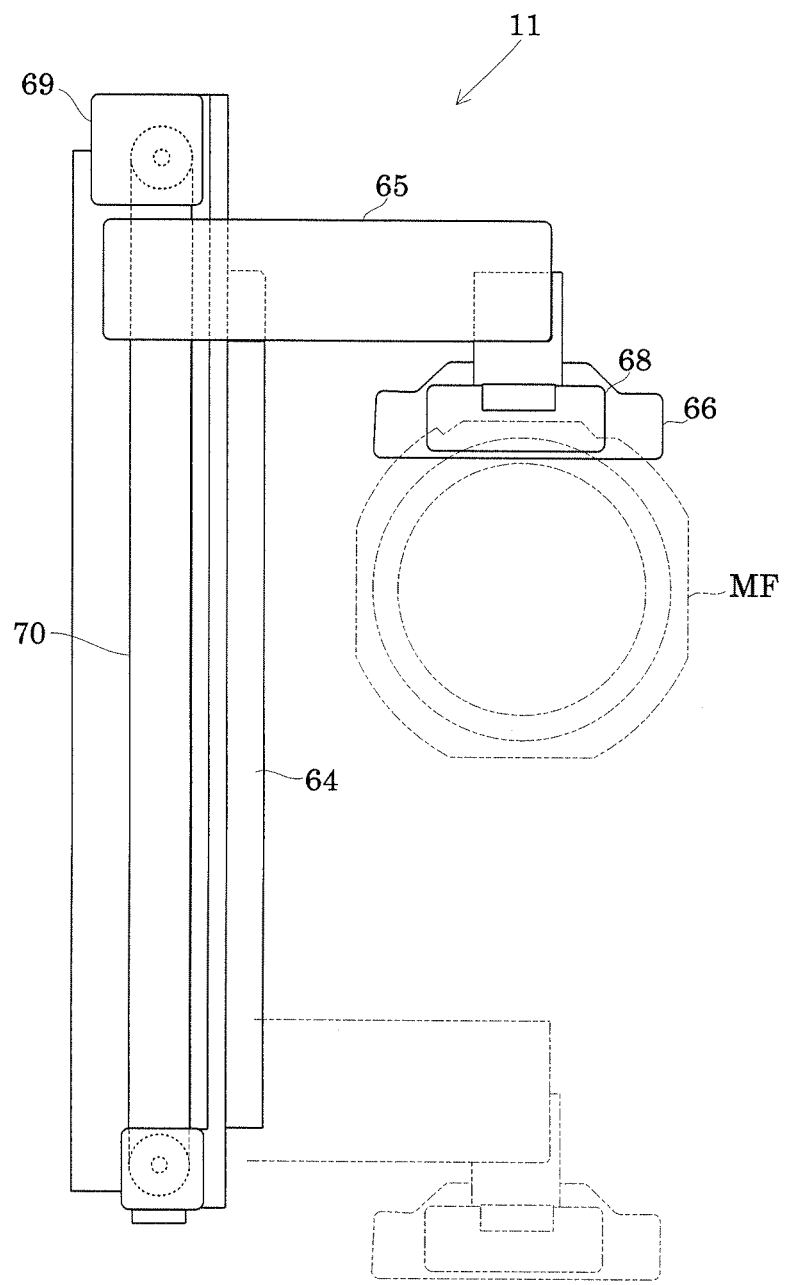
FIG. 15 is a plan view of a pusher.
Figure 16:
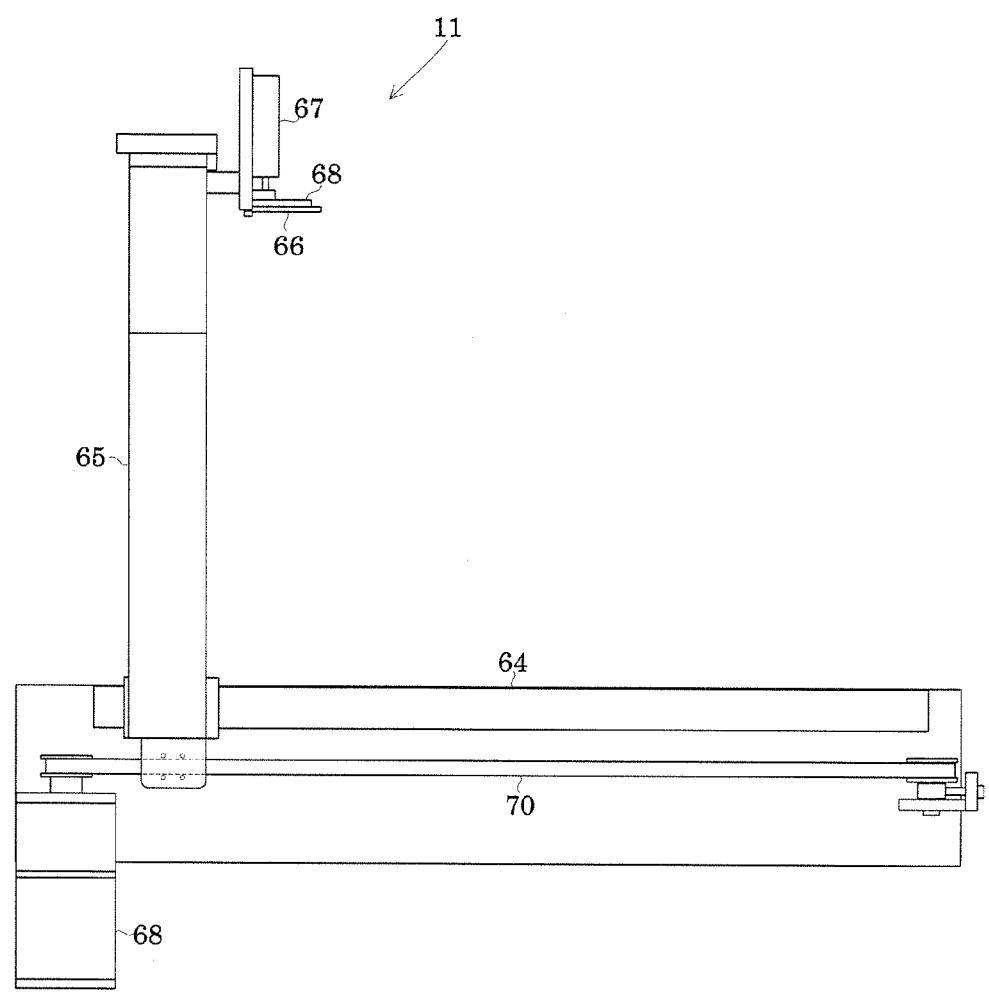
FIG. 16 is a front view of the pusher.

The pusher 11 houses the mount frame MF placed on the separation table 10 into the mount-frame collecting section 5, the detail configuration thereof being shown in FIGS. 15 and 16.

The pusher 11 has a chuck piece 68 provided on a movable table 65 that moves horizontally in the horizontal direction along a guide rail 64. The chuck piece 68 is opened and closed by a receiving piece 66 and a cylinder 67. The receiving piece 66 and the chuck piece 68 vertically grasp one end of the mount frame MF. Moreover, the movable table 65 has a bottom coupled to a belt 70 that is moved rotationally by a motor 69. Thus, when the motor 69 rotates forward/backward, the movable table 65 reciprocates in the horizontal direction.

Figure 17:
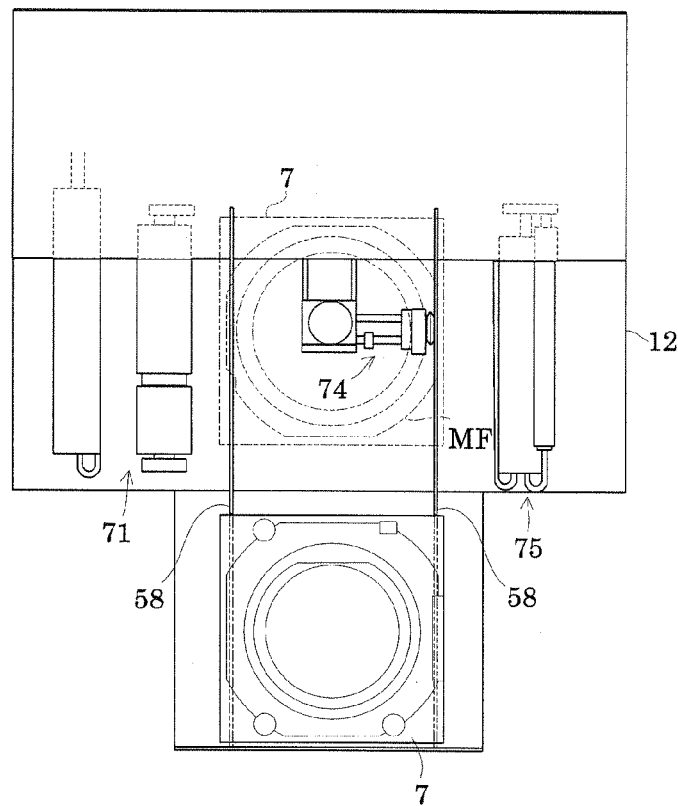
FIG. 17 is a plan view of a tape joining mechanism.
Figure 18:
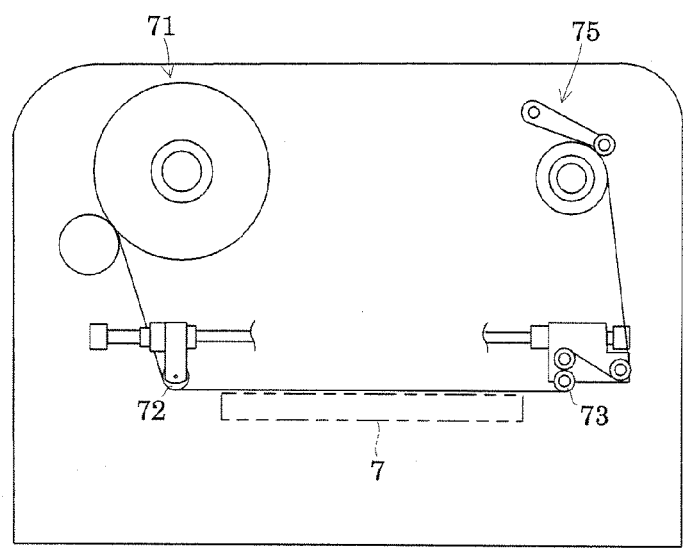
FIG. 18 is a front view of the tape joining mechanism.

As shown in FIGS. 17 and 18, the tape joining mechanism 12 has a tape supply section 71, a joining roller 72, a separation roller 73, a tape cutting mechanism 74, and a tape collecting section 75. The tape supply section 71 houses a wide adhesive tape DT in a roll form. That is, when the holding table 7, on which the wafer W and the ring frame f are placed, arrives at a tape joining position, the joining roller 72 moves from right to left in FIG. 17. Thus, the adhesive tape DT is joined onto wafer W and the ring frame f.

Upon completion of joining the tape, a disk cutter blade turns while the tape cutting mechanism 74 has moved downward, and cuts the joined adhesive tape DT along the ring frame f. Next, the separation roller 73 moves from right to left as in FIG. 17 to separate an unnecessary portion of the cut adhesive tape DT, which remains outside a cutting line thereof, from the ring frame f. Next, the tape collecting section 75 winds up and collects the separated unnecessary tape.

Figure 19:
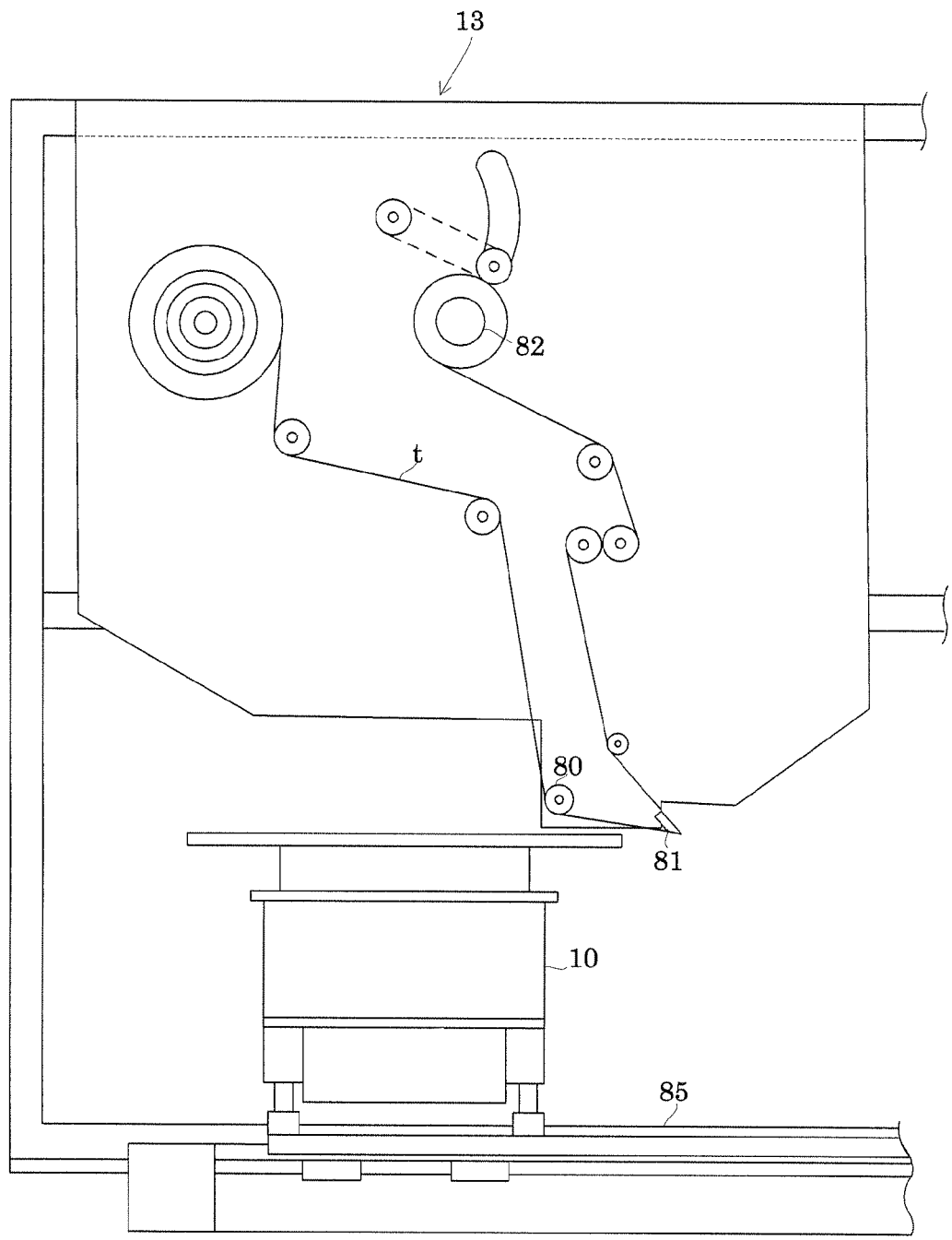
FIG. 19 is a front view of a separating mechanism.

The separation mechanism 13 has the following configuration as in FIG. 19. That is, a guide roller 80 guides a separation tape t in a roll form to a knife edge-shaped separation bar 81. The separation tape t has a width smaller than the diameter of the wafer. The separation bar 81 folds back the separation tape t, and thereafter, a winding shaft 82 winds up and collects the separation tape t.

As shown in FIG. 2, the mount-frame collecting section 5 includes a cassette 90 for collecting and stacking the mount frames MF. The cassette 90 includes an upright rail 92 coupled to and fixed on an apparatus framework 91, and a lifting table 94 driven by a motor 93 so as to move vertically in a screw feed manner along the upright rail 92. Thus, the mount-frame collecting section 5 enables the mount frame MF to be placed on the lifting table 94 and to move downward in a pitch feed manner.

Description will be given next of operation for manufacturing a mount frame MF with use of the apparatus in the foregoing example.

The ring frame f is transported from the frame supply section 8 to the holding table 7, and simultaneously the wafer W is transported from the container 3 to the holding table 7.

The frame transport device 16 suction-holds the ring frame f from the frame supply section 8, and places it on the holding table 7 (Step S1). The frame holder 56 releases its suction-holding of the ring frame f and moves upward. Then, a support pin aligns the ring frame f (Step S18). That is, the ring frame f is set on standby on the holding table 7 until the wafer W is transported.

As shown in FIG. 10, the workpiece transport device 15 moves the holding arm 38 above the container 3 and moves it downward to a given level while the pads 41 are directed downward. The compressor operates under negative pressure at the given level, whereby the carrying-out object (hereinafter, simply referred to as a "workpiece") on the uppermost is suction-held by with the pads 41 of the holding arm 38, and the workpiece is moved upward into a given level above the container 3 (Step S10).

Upon reaching the given level, the first discriminating sensor 52 detects a front surface of the workpiece held by the holding arm 38 (Step S11). The detection result is sent to a front-surface discriminating section 97 of a controller 95. The controller 95 includes a memory 96 where a reference range of a color tone level is set in advance. Here, a back surface of a wafer W to which a back grinding process is subjected, a circuit surface of a wafer W, a protective tape PT, and a spacer 17 each have different color tone levels. Consequently, the front-surface discrimination section 97 determines, from detection result, which color tone level is included in the reference range of the memory 96. That is, it is determined that a workpiece is either a wafer W or a spacer 17. In addition, where it is determined that the workpiece is a wafer W, it is further determined whether or not a protective tape PT is on the front surface (Step S12).

Then, where the protective tape PT is not on the front surface of the wafer W, the process proceeds to Step S13. Where the protective tape PT is on the front surface of the wafer W, the process proceeds to Step S15. Where the determined result is a spacer 17, the process proceeds to Step S30. Each of these steps will be described for every case.

<Where it is Determined that the Workpiece is a Wafer W>

In Step S13, as shown in two-dot chain lines in FIGS. 10 and 11, the workpiece transport device 15 moves forward such that the back surface of the wafer W is over the second discriminating sensor 53, whereby the second discriminating sensor 53 detects the back surface of the wafer W. The second discrimination sensor 53 sends the result to a back-surface discrimination section 98.

The back-surface discrimination section 98 determines, from detection result, which color tone level is included in the reference range of the memory. That is, it is determined whether or not the protective tape PT is on the back surface of the wafer W (Step S14). Where the back-surface discrimination section 98 determines that the protective-tape PT is on the back surface of the wafer W, a flag is set. Simultaneously, the workpiece transport device 15 transports the wafer W to the aligner 6 in that condition (Step S16).

Where determining that the protective tape PT is not on the back surface of the wafer W, the back-surface discriminating section 98 determines either front surface or the back surface includes a color tone level within the reference range for the circuit surface through comparison of their color tone levels from detection result. Where the back-surface discrimination section 98 determines that the front surface is a circuit surface, the process proceeds to Step S15.

The aligner 6 suction-holds the wafer W at a center thereof with a suction pad 77 shown in FIG. 1 projecting from a center of the aligner 6. Simultaneously, the workpiece transport device 15 releases suction-holding of the wafer W and retracts upward. The suction pad 77 is housed within the table and the aligner 6 aligns the wafer W based on a notch, etc., of the wafer W (Step S17).

Upon completion of the alignment, the suction pad 77 suction-holds the wafer W projects from the surface of the aligner 6. The workpiece transport device 15 moves to the position, and the front surface of the wafer W is suction-held. Thereafter, the suction pad 77 releases its suction and moves downward.

The workpiece transport device 15 moves to a position above the holding table 7, and places the wafer W on the wafer holding table 55 while the surface with the protective tape being directed downward (Step S18).

Upon completion of setting the wafer W and the ring frame f on the holding table 7, the wafer holding table 55 moves downward and the upper surface of the wafer W is equal in level to that of the ring frame f. Thereafter, the holding table 7 moves to the tape joining mechanism 12 along a rail 58.

When the holding table 7 reaches a transport position of the tape joining mechanism 12, the joining roller 72 moves downward to roll on the adhesive tape DT from right to left. Consequently, the adhesive tape DT is joined to the ring frame f and the rear face of the wafer W. When the joining roller 72 reaches its termination position, the tape cutting mechanism 74 moves downward to cut the adhesive tape DT while turning the cutter with a round blade along the ring frame f.

Upon completion of cutting the adhesive tape DT, the tape cutting mechanism 74 moves upward. Thereafter, the separation roller 73 moves from right to left, thereby winding up and collecting the unnecessary adhesive tape after cut out (Step S19).

Upon completion of manufacturing the mount frame MF, the holding table 7 moves to a setting position of the rectangular section A in FIG. 1, and then stops. Here, the frame transport device 16 suction-holds and transports the manufactured mount frame MF for delivering it to the reversing unit 9.

The reversing unit 9 reverses the mount frame MF to place it on the separation table 10, the surface of the mount frame MF with the protective tape being directed upward (Step S20).

The controller 95 determines the presence or absence of the flag (Step S21). Where it is determined that there is no flag, the process proceeds to Step S23. Where it is determined that there is no protective tape PT, the process proceeds to Step S22. That is, the separation table 10 moves to a transport position of the separating mechanism 13.

When the separation table 10 reaches the transport position of the separating mechanism 13, the separation bar 81 moves downward into a position of the mount frame MF where the separation tape t starts to be joined. The separation bar 81 presses to join the separation tape t to the protective tape PT, and thereafter the separation table 10 moves. In synchronization with movement of the separation table 10, the separation tape t is wound up on the winding shaft 82. Consequently, the protective tape PT is separated from the wafer W together with the separation tape t.

Upon completion of separating the protective tape PT, the separation bar 81 moves upward to return to its standby position. Simultaneously, the separation table 10 moves to a standby position of the pusher 11 in the rectangular section A. The chuck piece 68 of the pusher 11 suction-holds the mount frame MF to transport it to the frame collecting section 9 (Step S23).

As noted above, a round of operations for manufacturing a mount frame MF is completed using a wafer W with a protective tape. The controller 95 performs a comparison-computation process about whether or not a count value of the mount frame MF reaches a given number (Step S24). Where the count value does not reach the given number, the processes subsequent to Step S1 are to be repeated.

<Where the Protective Tape is on the Front Surface or the Front Surface is a Circuit Surface>

The workpiece transport device 15 reverses the holding arm 38 in a given space on the transport path between the container 3 and the aligner 6. The surface with the protective tape or the circuit surface of the wafer W is reversed to be directed downward. In this state, the wafer W is placed on the aligner 6 (Step S15). Thereafter, the same processes as the above Steps S16 to S24 are performed.

<Where the Workpiece is a Spacer>

The workpiece transport device 15 transports the spacer 17 to the spacer-collecting container 4 (Step S30).

According to the apparatus in the foregoing example, the first discriminating sensor 52 detects the front and back surfaces of the carrying-out object and determines either the semiconductor wafer W or the spacer 17 is the carrying-out object in accordance with the detection result. Moreover, where it is determined that the carrying-out object is a wafer W, it can be determined whether or not the protective tape is on the front surface of the wafer W. Moreover, where it is determined that the carrying-out object is a wafer W, the second discriminating sensor 52 can detect the back surface of the carrying-out object and can determine the condition of the back surface of the semiconductor wafer in accordance with the detection result. That is, the second discriminating sensor 52 can determine whether or not the protective tape PT is on the back surface of the wafer W, and can also determine which surface is a circuit surface when it is determined that there is no protective tape PT.

Consequently, accidental collection of the wafer W into the spacer-collecting container 4 can be avoided. Moreover, accidental mounting of the spacer 17 can be avoided. Alternatively, accidental mounting of the wafer by confusing the front surface with the back surface thereof can be avoided.

Moreover, the first discriminating sensor 52 is disposed above the container 3. The second discriminating sensor 53 is disposed adjacent to an outer periphery of the container 3. Consequently, the carrying-out object can be discriminated only by minimized movement of the workpiece transport mechanism 15.

This invention may be embodied as the following aspects.

(1) Where the protective tape PT is not on the front and back surfaces of the wafer W in the foregoing example, the following process may be performed.

The workpiece transport device 15 once returns the wafer W to the container 3, suction-holds the spacer 17 from the spacer-collecting container 4, and transports the spacer 17 to the holding table 7. Subsequently, the workpiece transport device 15 again unloads the wafer W from the container 3 for performing alignment by the aligner 6, and transports the wafer W to the holding table 7. That is, the wafer W is placed on the spacer 17 with the circuit surface of the wafer W directed downward. Here, a material having permeability is used for the spacer 17. Consequently, since the wafer W placed on the holding table 7 is suction-held via the spacer 17, the wafer W never shifts during joining of the tape.

The frame transport device 16 transports the manufactured mount frame MF from the holding table 7, and thereafter the workpiece transport device 15 suction-holds the spacer 17 and returns it to the spacer-collecting section 5.

(2) In the apparatus according to the foregoing example, a color sensor is used for the first discrimination sensor 52 and second discrimination sensor 53. Such sensor is not limitative. Specifically, an element may be adopted that can determine the material and condition of the front and back surfaces of the carrying-out object. For instance, it may be an optical camera.

(3) The apparatus according to the foregoing example may determine a cushioning material 51 on the bottom of the container 3. Where it is determined that the cushioning material 51 is on the bottom, the workpiece transport device 15 returns the cushioning material 51 to the container 3.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A semiconductor wafer mounting method for mounting a semiconductor wafer on a ring frame via a supporting adhesive tape, comprising:

prior to generating a mount frame having the ring frame integrate with the semiconductor via the adhesive tape, (A) discriminating a carrying-out object between the semiconductor wafer and a spacer;

(B) discriminating a protective tape from the semiconductor wafer; and (C) discriminating a circuit surface of the semiconductor wafer;

wherein (B) is performed in accordance with the result of (A), (C) is performed in accordance with the result of (B), and (A) to (C) are performed as follows:

(a) during transportation of the carrying-out object as the semiconductor wafer and the carrying-out object as the spacer that are alternately stacked in a receiving container by a transport mechanism, detecting a front surface of the carrying-out object by a first discrimination sensor and discriminating the carrying-out object between the semiconductor wafer and the spacer in accordance with a detection result, thereby performing (A);

(b-1) determining whether or not a protective tape is on the front surface of the semiconductor wafer by detecting the front surface of the semiconductor wafer with a first discrimination sensor, and (b-2) when it is determined that the protective tape is not on the front surface of the semiconductor wafer, detecting a back surface of the semiconductor wafer with a second discrimination sensor to determine whether or not the protective tape is on the back surface of the semiconductor wafer, thereby performing (B), and (c) when it is determined from the detection performed in (B) by the second discrimination sensor that the protective tape is not on the back surface of the semiconductor wafer, comparing the detection results of the front and back surfaces of the semiconductor wafer and determining a circuit surface thereof, thereby performing (C);

(D) after performing (A) to (C), placing the semiconductor wafer having the surface with the protective tape or the circuit surface directed downward by the transport mechanism onto an alignment stage and aligning the semiconductor wafer with the alignment stage, (E) joining the supporting adhesive tape over both the surface of the semiconductor wafer that is directed upward and the ring frame with a tape joining mechanism, (F) reversing the semiconductor wafer with the protective tape, placing the semiconductor wafer on a holding table by the transport mechanism, and separating the protective tape from the semiconductor wafer with a separating mechanism;

(G) collecting only the mount frame from which the protective tape is separated; and (H) transporting the spacer discriminated in (A) into a spacer-collecting section by the transport mechanism.

2. The semiconductor wafer mounting method according to claim 1, further comprising:

disposing the first discriminating sensor above the receiving container and detecting the front surface of the carrying-out object during lifting up the semiconductor wafer from the receiving container by the transport mechanism; and disposing the second discriminating sensor adjacent to an outer periphery of the receiving container and detecting the back surface of the semiconductor wafer through horizontal movement of the transport mechanism.

3. The semiconductor wafer mounting method according to claim 1, wherein the spacer has permeability, and wherein, when it is determined that the protective tape is not on the semiconductor wafer;

the semiconductor water is returned to the receiving container, and a spacer is unloaded from the spacer collecting section by the transport mechanism and is transported to a joining position of the adhesive tape, the semiconductor wafer is unloaded from the receiving container by the transport mechanism, is placed on the spacer with the circuit surface of the aligned semiconductor wafer being directed downward, and the adhesive tape is joined over both the ring frame and the surface of the semiconductor wafer that is directed upward to manufacture a mount frame, and the manufactured mount frame is carried out, and then the spacer is unloaded and transported into the spacer-collecting section.

4. The semiconductor wafer mounting method according to claim 1, wherein the first discriminating sensor determines a cushioning material on the bottom of the receiving container, and the transport mechanism returns the cushioning material to the receiving container when it is determined that the carrying-out object is the cushioning.

* * * * *